United States Patent [19]

Ohtsuka et al.

[11] Patent Number: 5,081,510

[45] Date of Patent: * Jan. 14, 1992

[54] HIGH-VOLTAGE SEMICONDUCTOR DEVICE HAVING A RECTIFYING BARRIER, AND METHOD OF FABRICATION

[75] Inventors: Koji Ohtsuka, Shiki; Hirokazu Goto, Hannou, both of Japan

[73] Assignee: Sanken Electric Co., Ltd., Saitama, Japan

[*] Notice: The portion of the term of this patent subsequent to Jun. 25, 2008 has been disclaimed.

[21] Appl. No.: 427,734

[22] Filed: Oct. 26, 1989

[30] Foreign Application Priority Data

Nov. 11, 1988 [JP] Japan ................. 63-285048

[51] Int. Cl.⁵ ............... H01L 29/48; H01L 29/56; H01L 29/64
[52] U.S. Cl. ......................... 357/15; 357/52; 357/53; 357/71
[58] Field of Search ............. 357/15, 52, 71 S, 53, 357/59, 91

[56] References Cited

U.S. PATENT DOCUMENTS

| | | | |
|---|---|---|---|
| 3,652,905 | 3/1972 | Page | 317/235 |
| 3,907,617 | 9/1975 | Zwernemann | 307/15 |
| 4,062,033 | 12/1977 | Suzuki | 357/15 |
| 4,157,563 | 6/1979 | Bosselaar | 357/52 |
| 4,408,216 | 10/1983 | Gould | 357/71 S |
| 4,607,270 | 8/1986 | Iesaka | 357/15 |
| 4,862,229 | 8/1989 | Mundy et al. | 357/53 |
| 4,899,199 | 2/1990 | Gould | 357/15 |
| 4,980,749 | 12/1990 | Ohtsuka et al. | 357/52 |

FOREIGN PATENT DOCUMENTS

| | | | |
|---|---|---|---|
| 57-208178 | 12/1982 | Japan | 357/15 |
| 5846631 | 3/1983 | Japan | 357/15 |
| 59110173 | 5/1984 | Japan | 357/15 |
| 6020585 | 2/1985 | Japan | 357/15 |
| 60178670 | 9/1985 | Japan | 357/15 |
| 61-166164 | 7/1986 | Japan | 357/15 |

*Primary Examiner*—Rolf Hille
*Assistant Examiner*—Minhloan Tran
*Attorney, Agent, or Firm*—Woodcock, Washburn, Kurtz, Mackiewicz & Norris

[57] ABSTRACT

A semiconductor device such as a Schottky-barrier rectifier diode is disclosed which has a barrier electrode formed on a semiconductor substrate of gallium arsenide or the like. Formed around the barrier electrode is an annular resistive layer, typically of titanium oxide, creating a Schottky barrier at its interface with the semiconductor substrate. The resistive layer has a sheet resistance of more than 10 kilohms per square. In order to prevent preliminary breakdowns from taking place at the peripheral part of the resistive layer before final breakdown of the device, the sheet resistance of the resistive layer is made higher as it extends away from the barrier electrode. For the ease of manufacture, the resistive layer can be divided into two or more annular regions of distinctly different sheet resistances.

20 Claims, 4 Drawing Sheets

HIGH-VOLTAGE SEMICONDUCTOR DEVICE HAVING A RECTIFYING BARRIER, AND METHOD OF FABRICATION

BACKGROUND OF THE INVENTION

Our invention relates to semiconductor devices, and more particularly to a high-voltage semiconductor device having a rectifying barrier or barriers as in the form of a Schottky barrier, a p-n junction, or both. Still more particularly, our invention deals with an improved high-voltage blocking technique in such semiconductor diodes or rectifiers. Our invention also specifically concerns a method of making such semiconductor devices.

Among the high-voltage blocking techniques heretofore suggested for Schottky-barrier or p-n junction semiconductor devices are the field plate, the field-limiting ring, and a combination of both. All these contrivances share the same objective of making the voltage-withstanding capability at the periphery of the main rectifying barrier as close as possible to that at its midportion. The listed prior art techniques are unsatisfactory in either the simplicity of construction, the ease of fabrication, or the extent to which the desired objective is accomplished.

Our own solution to this problem is what we call the RESP (REsistive Schottky barrier field Plate). We have described and claimed an adaptation of the RESP for Schottky-barrier semiconductor devices in our copending U.S. patent application Ser. No. 277,333 filed Nov. 29, 1988, and its adaptation for p-n junction semiconductor devices in our copending U.S. patent application Ser. No. 319,951 filed Mar. 7, 1989.

In these prior applications the RESP takes the form of a thin layer of titanium oxide in direct contact with a semiconductor substrate. The titanium oxide layer can be formed by thermally oxidizing a preformed titanium layer in situ on the semiconductor substrate. Its sheet resistance is constant throughout its expanse. A reverse current flows through the RESP upon application of a reverse voltage to the semiconductor device, with the consequent creation of a potential gradient therein that serves to mitigate field concentrations at the periphery of the main rectifying barrier. The overall voltage-withstanding capability of the device is thus materially improved.

The semiconductor specialists might be tempted to identify the RESP with the familiar high-resistivity field plate. The RESP distinctly differs from the conventional high-resistivity field plate, which overlies an insulating region, in making direct contact with a semiconductor region to form a Schottky barrier. This difference makes the RESP far superior to the high-resistivity field plate in voltage-withstanding capability and the stability of operation at elevated temperatures, as we have confirmed by experiment.

We must, however, admit a weakness of the RESP construction. As we stated in the U.S. patent application Ser. No. 319,951 cross-referenced above, a series of preliminary breakdowns take place at limited parts of the RESP periphery upon application of a reverse voltage, before the final breakdown of the device. Being limited by the resistivity of the RESP, the reverse current flowing as a result of the preliminary breakdowns is not so serious as to adversely affect the overall voltage-blocking capability of the device. The preliminary breakdowns are nevertheless undesirable as it involves the flow of reverse current, no matter how negligible its magnitude may be.

SUMMARY OF THE INVENTION

We have hereby discovered how to eliminate, as far as feasible, the noted preliminary breakdowns taking place in semiconductor devices of the RESP construction upon application of a reverse voltage and hence to enhance their reliability and utility.

Briefly stated in one aspect thereof, our invention concerns a semiconductor device comprising barrier electrode means formed on a semiconductor region for creating a rectifying barrier therebetween. At least one annular resistive layer, typically of titanium oxide, is also formed on the semiconductor region so as to surround the barrier electrode means, creating a Schottky barrier at its interface with the semiconductor region. The resistive layer is electrically connected to the barrier electrode means and has a sheet resistance which is higher than that of the barrier electrode means and which increases as the resistive layer extends away from the barrier electrode means.

The principles of our invention are applicable to both Schottky-barrier and p-n junction diodes. The noted barrier electrode means may therefore be either a barrier electrode for forming a Schottky barrier, another semiconductor region of opposite conductivity type for forming a p-n junction, or both. The rectifying barrier can be constituted of both a Schottky barrier and a p-n junction by incorporating the known guard ring with a Schottky-barrier semiconductor device.

Another aspect of our invention is directed to a method of fabricating the semiconductor device of the above summarized construction, with an emphasis on how to create the annular resistive layer having a sheet resistance that increases as the resistive layer extends away from the barrier electrode means. We suggest that the resistive layer be divided into two or more annular regions having progressively increasing sheet resistances from the inner toward the outer one. Such different sheet resistances can be imparted to the respective resistive regions by oxidizing annular parts of a preformed layer of titanium or the like to different degrees.

We will now explain how the improved RESP construction of our invention makes preliminary breakdowns less easy to occur. Upon application of a reverse voltage across the main rectifying barrier of the semiconductor device constructed as in the foregoing, a depletion layer is created due to the Schottky barrier between the annular resistive layer and the semiconductor region, in addition to the depletion region due to the main rectifying barrier. The two depletion layers combine into a single entity. Thus the annular resistive layer functions as the RESP, preventing field concentrations at the periphery of the main rectifying barrier.

Attention is invited to the fact that the sheet resistance of the annular resistive layer increases as it extends outwardly from the barrier electrode means. Consequently, the potential gradient set up in the resistive layer by reverse current is gentle at its portion close to the main rectifying barrier and is steep at its portion farther away therefrom. This gentle potential gradient at the resistive layer portion close to the main rectifying barrier serves to remarkably mitigate field concentrations at the peripheral part of the main rectifying barrier. Thus, as the peripheral part of the main rectifying barrier becomes less easy to suffer breakdown, the voltage-withstanding capability of the semiconductor device is materially improved.

Since the potential difference between the inner and outer extremities of the annular resistive layer due to the reverse current flowing before the occurrence of preliminary breakdowns, as well as the resistance between these extremities of the resistive layer, is high, preliminary breakdowns occur at a higher voltage than heretofore. Moreover, when preliminary breakdowns do take place, the resulting increase in reverse current is less than in the prior art. The improved semiconductor device of our invention thus attains the dual objective of withstanding high voltages and lessening the flow of reverse current. Experiment has also proved that the semiconductor device can be so designed according to our invention as to virtually eliminate preliminary breakdowns.

An additional advantage of our invention is that, in order to withstand a given voltage, the width of the annular resistive layer can be less than that of the prior art layer having the same sheet resistance in its width direction. A corresponding reduction in the size of the semiconductor device can therefore be accomplished.

The above and other features and advantages of our invention and the manner of realizing them will become more apparent, and the invention itself will best be understood, from a study of the following description and appended claims, with reference had to the attached drawings showing some preferred embodiments of our invention.

DESCRIPTION OF THE PREFERRED EMBODIMENTS

We will now describe our invention with reference to FIG. 1 which illustrates at (A) through (E) the sequential steps of fabricating a Schottky-barrier diode for high-speed rectification purposes by the method of our invention. The resulting Schottky diode itself, shown in FIG. 1(E) and therein generally designated 10, is also of novel construction in accordance with our invention.

Figure 1A:
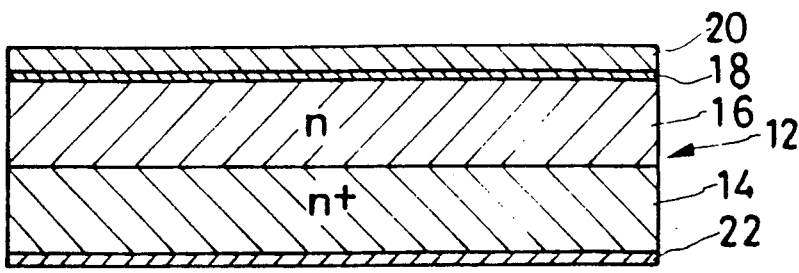
FIG. 1, consisting of (A) through (E), is a series of sectional illustrations showing the sequential steps of fabricating a Schottky-barrier diode by the method of our invention.

The fabrication of the Schottky diode started with the preparation of a gallium arsenide (GaAs) semiconductor substrate 12 shown in FIG. 1(A). The semiconductor substrate 12 was comprised of an n-type region 14 and, grown epitaxially thereon, an n-type region 16 of high resistance. The n-type region 14 had a thickness of 300 micrometers and an impurity concentration of $2 \times 10^{18}$ cm$^{-3}$. The n-type region 16 had a thickness of 15 micrometers and an impurity concentration of $1.8 \times 10^{15}$ cm$^{-3}$.

Then, as shown also in FIG. 1(A), we formed a titanium layer 18 and an aluminum layer 20 one after the other on the n-type region 16 of the semiconductor substrate 12 by vapor deposition. The titanium layer 18 was as thin as 0.005 micrometers (50 Å) whereas the aluminum layer 20 was two micrometers in thickness. FIG. 1(A) also shows an ohmic electrode 22 formed on the n-type region 14 of the semiconductor substrate 12 by the vapor deposition of a gold-germanium alloy.

Figure 1B:
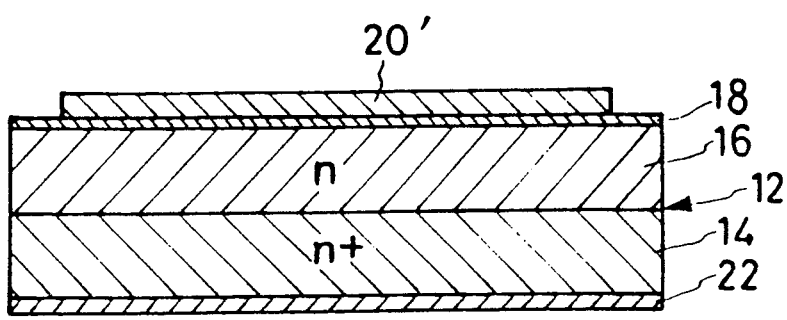

Then we photoetched away an annular peripheral part of the aluminum layer 20, as shown in FIG. 1(B), thereby exposing a corresponding part of the underlying titanium layer 18. The remaining central part of the aluminum layer is designated 20'.

Then we heated the FIG. 1(B) article in an oxidizing atmosphere of air for oxidizing the exposed annular peripheral part of the titanium layer 18 into a titanium oxide region. The titanium oxide region of annular shape thus formed is indicated at 24 in FIG. 1(C). Having been masked by the aluminum layer 20', the central part of the titanium layer 18 remained unoxidized. This unoxidized part is designated 18' by way of contradistinction from the original titanium layer 18 and from the surrounding titanium oxide region 24.

Figure 1C:
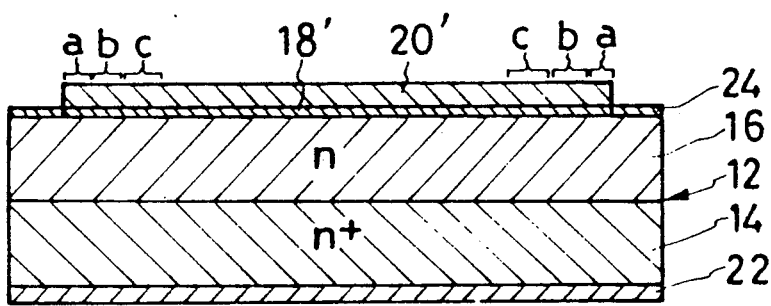
Figure 1D:
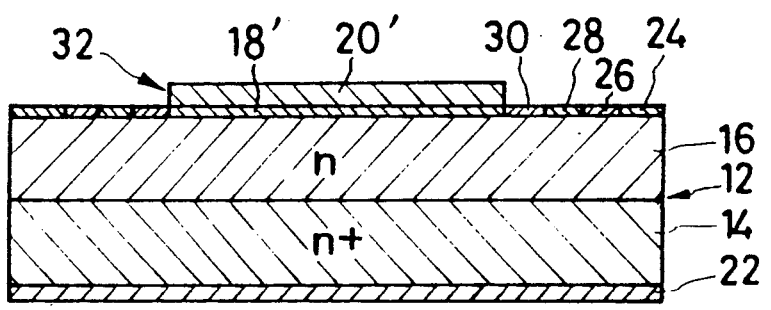

Then we photoetched away an annular peripheral part a, FIG. 1(C), of the aluminum layer 20' and proceeded to oxidize the thus-exposed part of the underlying titanium layer 18' by heat treatment in air. FIG. 1(D) shows the resulting second titanium oxide region 26 of annular shape disposed inwardly of, and contiguous to, the first recited titanium oxide region 24. The sheet resistance of this second titanium oxide region 26 must be lower than that of the first titanium oxide region 24 for the reasons to be set forth subsequently. Therefore, we made the time of the second heat treatment shorter than that of the first heat treatment, although we could have made the temperature of the second heat treatment less than that of the first heat treatment for the same purpose.

Then we again photoetched away an annular peripheral part b, FIG. 1(C), of the remaining aluminum layer 20' and again proceeded to oxidize the thus-exposed part of the underlying titanium layer 18' by heat treatment in air. FIG. 1(D) shows the resulting third titanium oxide region 28 of annular shape disposed inwardly of, and contiguous to, the second titanium oxide region 26. The sheet resistance of the third titanium oxide region 28 must be still lower than that of the second titanium oxide region 26. We therefore made the time of the third heat treatment shorter than that of the second heat treatment, although we could have made the temperature of the third heat treatment less than that of the second heat treatment for the same purpose.

Then we again photoetched away an annular peripheral part c, FIG. 1(C), of the remaining aluminum layer 20' and again proceeded to oxidize the thus-exposed part of the underlying titanium layer 18' by heat treatment in air. FIG. 1(D) shows the resulting fourth titanium oxide region 30 of annular shape disposed inwardly of, and contiguous to, the third titanium oxide region 28. The sheet resistance of this fourth titanium oxide region 30 must also be lower than that of the third titanium oxide region 28. We therefore made the time of the fourth heat treatment shorter than that of the third heat treatment, although we could have made the temperature of the fourth heat treatment less than that of the third heat treatment for the same purpose.

We have thus completed the article of FIG. 1(D), in which the four annular titanium oxide regions 24, 26, 28 and 30 were arranged peripherally on the n-type region 16 of the semiconductor substrate 12. Disposed inside these titanium oxide regions, the remaining titanium layer 18' and aluminum layer 20' made up in combination a Schottky-barrier electrode 32.

We are not certain of the thickness of the titanium oxide regions 24, 26, 28 and 30, but it may be approximately 1.5 times the thickness of the initial titanium layer 18. The sheet resistances of the titanium oxide regions 24, 26, 28 and 30 were 50,000, 1000, 300 and 100 megohms per square, respectively.

The inner three titanium oxide regions 26, 28 and 30 have proved to serve to create a Schottky barrier at their interface with the n-type region 16 and so function as the RESP. The outermost titanium oxide region 24 seems to hardly serve the purpose of the RESP but to function merely as a insulating region stabilizing the semiconductor surface.

Figure 1E:
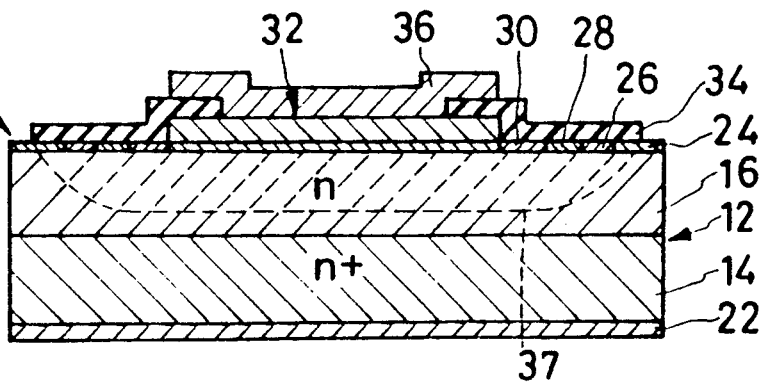

Following the fabrication of the FIG. 1(D) article we proceeded to form a protective film of silicon oxide layer 34, FIG. 1(E), over the titanium oxide regions 24–30 by the known plasma-CVD (chemical vapor deposition) technique. The silicon oxide layer 34 adheres so firmly to the titanium oxide regions 24–30 that the outermost titanium oxide region 24 in particular is believed to serve the additional purpose of preventing accidental detachment of the silicon oxide layer from the semiconductor substrate 12.

Then we formed an anode or connection electrode 36 on the Schottky-barrier electrode 32. Although we showed the anode 36 in FIG. 1(E) as a layer of a single substance for illustrative convenience, it was actually a lamination of a titanium layer and an aluminum layer, with the former underlying the latter. The fabrication of the Schottky diode 10 was thus completed.

Figure 2:
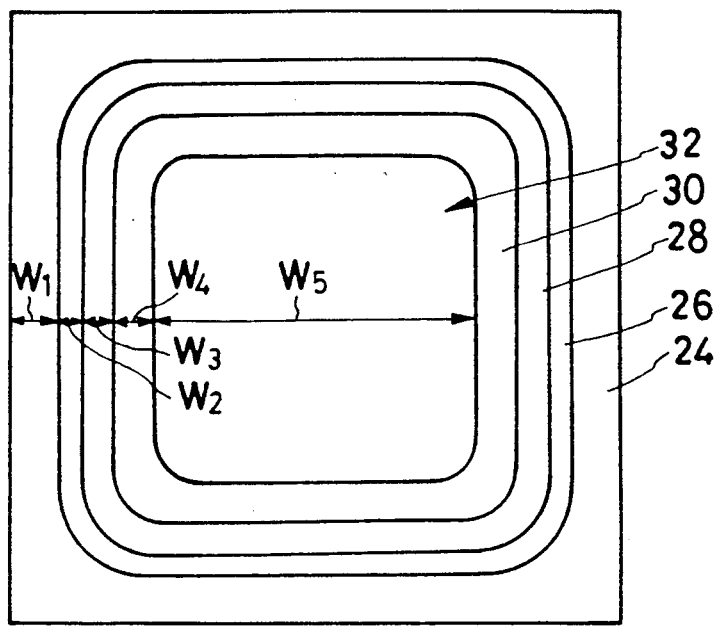
FIG. 2 is a top plan of the Schottky-barrier diode fabricated through the procedure of FIG. 1, the view not showing the silicon oxide layer and anode of the diode to reveal the underlying parts.

Reference is now directed to FIG. 2 which shows the thus-fabricated Schottky diode 10 with the silicon oxide layer 34 and anode 36 removed and as seen from above. It will be noted that the four annular titanium oxide regions 24–30 surround the Schottky-barrier electrode 32. Typically, the widths $W_1$, $W_2$, $W_3$ and $W_4$ of these titanium oxide regions 24–30 are 140, 20, 30 and 40 micrometers, respectively. The horizontal dimension $W_5$ of the Schottky-barrier electrode 32 is 900 micrometers.

The outermost or first titanium oxide region 24 was so thoroughly oxidized that we believe it can be considered an insulating region. Its composition must be more or less close to titanium dioxide. The second to fourth titanium oxide regions 26–30 on the other hand, were oxidized to lesser degrees into $TiO_x$ where x is less than two. These three regions may therefore be described as semi-insulating or high-resistance regions, forming a Schottky barrier at their interface with the n-type semiconductor region 16. The sheet resistance of the Schottky-barrier electrode 32 is 0.05 ohm per square, and that of the unoxidized titanium layer 18 is 200 ohms per square. The sheet resistances of the second to fourth titanium oxide regions 26–30 are therefore much higher than those of the Schottky-barrier electrode 32 and the titanium layer 18.

Upon application of a reverse voltage between the anode 36 and ohmic electrode 22 of the Schottky diode 10, a depletion region is created in the n-type semiconductor region 16 due to the Schottky barrier between the barrier electrode 32 and the n-type semiconductor region. The Schottky barrier between the second to fourth titanium oxide regions 26–30 and the n-type semiconductor region 16 also gives rise to a depletion region. The thus-created two depletion regions combine into a whole indicated by the broken lines and designated 37 in FIG. 1(E).

Experiment has proved that the method of FIG. 1 makes possible the efficient production of diodes capable of withstanding voltages of well over 200 volts. Also, we experimented the utility of the thus-fabricated diodes as rectifiers in high-frequency switching regulators with a switching frequency of one megahertz. We confirmed their higher-speed response and the production of less rectification noise than had been exhibited by their predecessors disclosed in the aforementioned U.S. patent applications.

Figure 3:
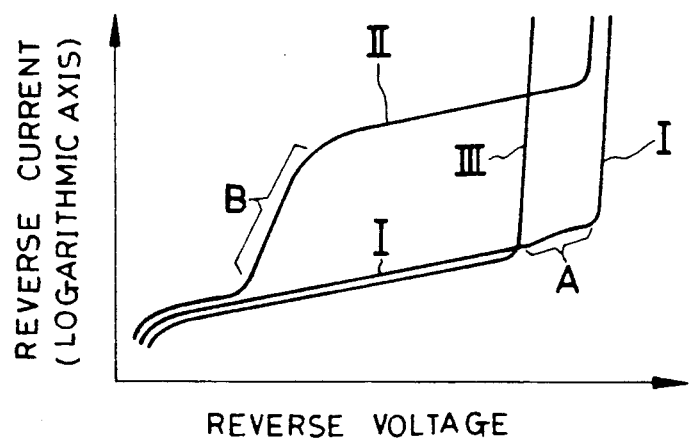
FIG. 3 is a graphic representation of the reverse-voltage-versus-reverse-current characteristics of the Schottky-barrier diode of FIGS. 1 and 2 and of two other diodes of comparable prior art constructions.

The curve I in the graph of FIG. 3 represents the typical reverse-voltage-versus-reverse-current characteristic of the Schottky barrier diodes of the FIG. 1(E) construction. A series of preliminary breakdowns, set forth in connection with the prior art, are seen at A of the curve I, but only with a negligible increase in reverse current. It must also be pointed out that, contrary to the illustrated curve I, a substantial proportion of the diodes fabricated in accordance with our invention exhibited no such preliminary breakdowns.

We have shown the curves II and III of FIG. 3 by way of comparison. Both curves indicate the characteristics of noninventive Schottky barrier diodes which were basically of the same construction as the inventive diode 10 except that the second to fourth titanium oxide regions 26–30 of the different sheet resistances in the inventive diode were replaced by a titanium oxide region of unvarying sheet resistance in each noninventive diode. The single titanium oxide region of the noninventive diode of the curve II had a lower sheet resistance than that of the noninventive diode of the curve III.

It will be noted that the noninventive diode of the curve II is comparable in voltage-blocking capability to the inventive diode of the curve I. However, the width of the titanium oxide region of this noninventive diode had to be made considerably more than the sum of the widths ($W_2+W_3+W_4$) of the titanium oxide regions 26–30 of the inventive diode. What is worse, the curve II indicates a marked increase in reverse current as a result of preliminary breakdowns. No preliminary breakdown took place with the noninventive diode of the curve III, but its voltage-blocking capability was much lower than that of the inventive diode of the curve I.

We conclude from the results of FIG. 3 that the inventive diode 10 with its titanium oxide regions 26–30 of different sheet resistances possesses distinct advantages over the noninventive diodes in terms of voltage-blocking capability and low reverse current. Experiment has proved that these results hold true no matter what sheet resistance is given to the titanium oxide regions of the noninventive diodes. Our invention realizes a substantial reduction in the size of semiconductor chips and a curtailment of the manufacturing cost through a decrease in the amount of the expensive semiconductor material.

Second Form

Figure 4:
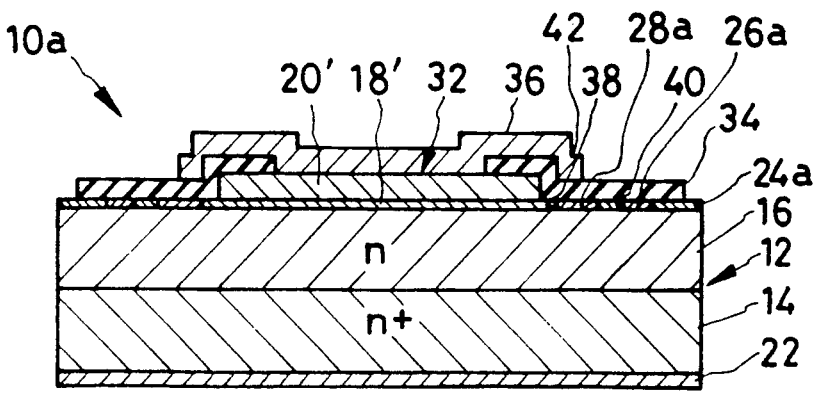
FIG. 4 is a section through another preferred form of Schottky-barrier diode constructed in accordance with our invention.

FIG. 4 shows a Schottky-barrier diode 10a of alternative construction. This diode 10a has but three annular titanium oxide regions 24a, 26a and 28a and additionally comprises two annular unoxidized titanium regions 38 and 40 formed on the n-type region 16 of the semiconductor substrate 12. The titanium region 38 is disposed between the titanium layer 18' of the Schottky-barrier electrode 32 and the titanium oxide region 28a, and the other titanium region 40 between the two titanium oxide regions 26a and 28a. The alternative diode 10a also differs from the first disclosed diode 10 in that the anode or connection electrode 36 has an annular peripheral extension 42 overlying the inmost titanium oxide region 28a to serve as a field plate. The other details of construction are as previously set forth in connection with the diode 10, so that we have indicated the various other parts of the alternative diode 10a by the same reference characters as used to denote the corresponding parts of the diode 10.

The three titanium oxide regions 24a–28a can be formed by the same method as the four titanium oxide regions 24–30 of the FIG. 1 diode 10. The typical sheet resistances of the titanium oxide regions 24a–28a are 50,000, 1000 and 200 megohms per square, respectively. The outermost or first titanium oxide region 24a serves primarily for surface stabilization like the titanium oxide region 24 of the diode 10. The second and third titanium oxide regions 26a and 28a function as the RESP, creating Schottky barriers at their interfaces with the n-type semiconductor region 16, like the titanium oxide regions 26–30 of the diode 10. The typical widths of the annular titanium oxide regions 24a–28a are 140, 30 and 80 micrometers, respectively.

For the creation of the two unoxidized titanium regions 38 and 40, parts of an aluminum layer equivalent to that shown at 20 in FIG. 1 may be left as a mask on the titanium layer until the heat treatments for the provision of the titanium oxide regions 24a–28a are completed. The masking parts of the aluminum layer may then be removed from over the unoxidized titanium regions 38 and 40. Both unoxidized titanium regions 38 and 40 may be 200 ohms per square in sheet resistance and 20 micrometers in width. They create Schottky barriers at their interfaces with the n-type semiconductor region 16.

The inner unoxidized titanium region 38 may be thought of as an additional Scottky-barrier electrode complementary to the main Schottky-barrier electrode 32. We have confirmed that its presence between third titanium oxide region 28a and main Schottky-barrier electrode 32 improves the voltage-blocking capability of the diode, particularly during operation at high switching speed. The sheet resistance of this unoxidized titanium region 38 should be from 20 ohms to 100 kilohms per square for the best results.

The outer unoxidized titanium region 40 serves substantially as an equipotential region effective to improve the stability of potential distributions over the neighboring titanium oxide regions 26a and 28a during application of a reverse voltage. Thus the region 40 also contributes toward the higher voltage-blocking capability of the diode.

Despite the presence of the outer unoxidized titanium region 40, the sheet resistance by increments with a distance from the main Schottky-barrier electrode 32 from the inner edge of the third titanium oxide region 28a to the outer edge of the second titanium oxide region 26a. Therefore, essentially, this diode 10a is equivalent to the diode 10 in both construction and performance characteristics.

Third Form

Figure 5:
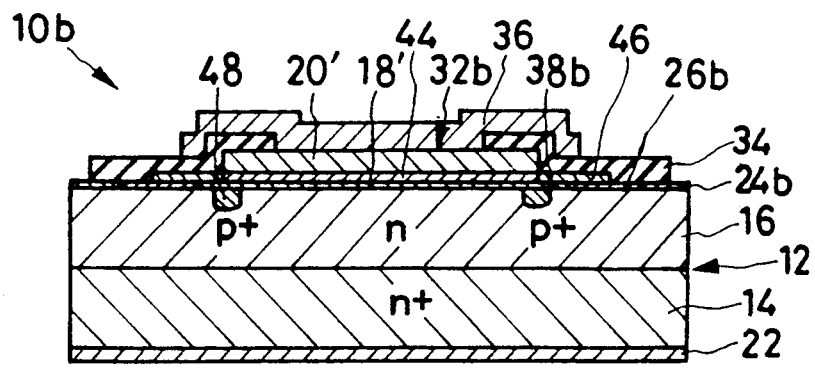
FIG. 5 is a section through still another preferred form of Schottky-barrier diode constructed in accordance with our invention.

In FIG. 5 we have shown another alternative Schottky-barrier diode 10b featuring a main Schottky-barrier electrode 32b of modified construction. The modified electrode 32b is comprised of the unoxidized titanium layer 18' in direct contact with the n-type semiconductor region 16, another unoxidized titanium layer 44 overlying the layer 18', and the aluminum layer 20' overlying the layer 44. The lowermost unoxidized titanium layer 18' is electrically connected to two titanium oxide regions 24b and 26b and to an unoxidized titanium region 38b. The titanium oxide regions 24b and 26b and the unoxidized titanium region 38b can be formed by essentially the same method as the titanium oxide regions 24a–28a and unoxidized titanium region 38 of the FIG. 4 diode 10a.

The diode 10b also features still another titanium oxide region 46 which is electrically connected to the unoxidized titanium layer 44. Substantially annular in shape, the titanium oxide region 46 overlies the unoxidized titanium region 38b and part of the titanium oxide region 26b.

The sheet resistances of the titanium oxide regions 24b, 26b and 46 are 50,000, 1000 and 200 megohms per square, respectively. The titanium oxide region 46 overlaps the titanium oxide region 26b to an extent of 80 micrometers. The sheet resistance of these lapping portions is 200 megohms per square, which value is determined by the titanium oxide region 46. That outer part of the titanium oxide region 26b which is not overlapped by the region 46 has a width of 30 micrometers and a sheet resistance of 1000 megohms per square. The titanium oxide region 24b has a width of 140 micrometers.

It is the titanium oxide regions 26b and 46 that constitute the RESP. The other titanium oxide region 24b functions like the titanium oxide region 24 of the FIG. 1 diode 10, contributing to surface stability. The unoxidized titanium region 38b functions like the unoxidized titanium region 38 of the FIG. 4 diode 10a, being effective to improve the voltage-blocking capability.

The diode 10b additionally includes an annular $p^+$-type guard ring 48 formed in the n-type semiconductor region 16 so as to extend along the periphery of the main Schottky-barrier electrode 32b. Therefore, in this diode 10b, the main rectifying barrier is a combination of the Schottky barrier between the n-type semiconductor region 16 and the main Schottky-barrier electrode 32b, and the p-n junction between the n-type semiconductor region 16 and the $p^+$-type region 48.

It will also be understood that the depletion region due to the noted RESP comprised of the titanium oxide regions 26b and 46 combine with the depletion region due to the main rectifying barrier. This diode 10b is therefore akin in construction and operation to the diodes 10 and 10a disclosed previously.

Fourth Form

Figure 6:
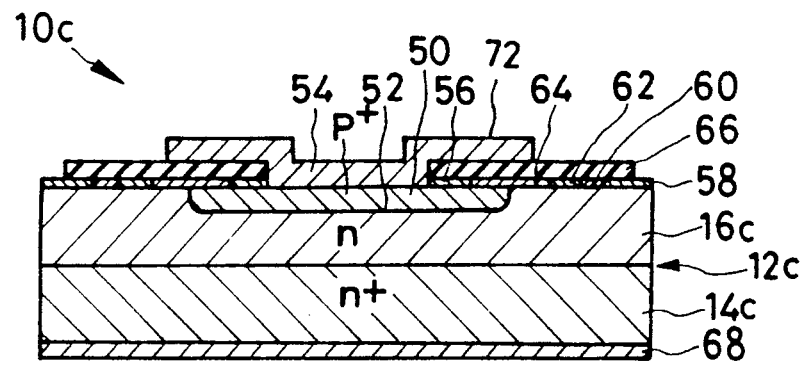
FIG. 6 is a section through a p-n junction diode constructed in accordance with our invention.
Figure 7:
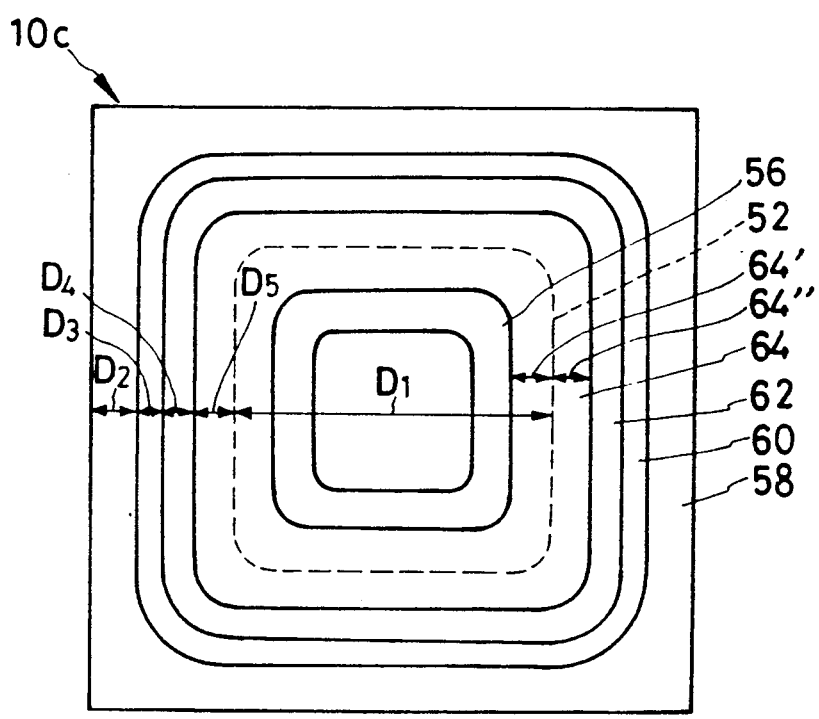
FIG. 7 is a top plan of the p-n junction diode of FIG. 6, the view not showing the ohmic electrode and silicon oxide layer of the diode to reveal the underlying parts.

The rectifier diode 10c shown in FIGS. 6 and 7 represents an adaptation of our invention for a p-n junction semiconductor device. It has a GaAs semiconductor substrate 12c comprising an n+-type region 14c and, formed by epitaxial growth thereon, a high-resistance n-type region 16c. The n+-type region 14c has a thickness of 300 micrometers and an impurity concentration of $2 \times 10^{18}$ cm$^{-3}$. The n-type region 16c has a thickness of 15 micrometers and an impurity concentration of $1.8 \times 10^{15}$ cm$^{-3}$.

A p+-type region 50 is formed in part of the n-type region 16c by diffusion of zinc. The thickness of the p+-type region 50 is three micrometers. Its mean specific resistance is significantly less than that of the n-type region 16c. As a result, upon application of a reverse voltage to the p-n junction 52 between n-type region 16c and p+-type region 50, the depletion region spreads from the junction 52 primarily in the n-type region 16c.

Formed as an anode on the P+-type region 50 is an ohmic electrode 54 which may typically take the form of a lamination of a layer of gold-germanium alloy and a gold layer. In FIG. 6, however, we have indicated the electrode 54 as being of a single layer for illustrative convenience.

The ohmic electrode 54 is contiguously surrounded by an annular unoxidized titanium region 56 which in turn is surrounded by four annular titanium oxide regions 58, 60, 62 and 64. These regions 56–64 are all formed on the semiconductor substrate 12c and all covered by a silicon oxide layer 66 which may be formed by plasma-CVD.

The titanium region 56 is as thin as 50 A (0.005 micrometer). We are not sure of the thickness of the titanium oxide regions 58–64, but it is supposedly approximately 1.5 times the thickness of the titanium region 56. The sheet resistances of the titanium oxide regions 58–64 are 50,000, 1000, 300 and 100 megohms per square, respectively.

It will be observed from FIG. 6 that the inmost titanium oxide region 64 extends across the exposed boundary of the p-n junction 52. Therefore, as indicated in FIG. 7, the inmost titanium oxide region 64 has a portion 64' overlying the p+-type region 50 and a portion 64'' overlying n-type region 16c. The unoxidized titanium region 56 and the portion 64' of the titanium oxide region 64 make nearly ohmic contact with the p+-type semiconductor region 50 and coact with this region 50 to provide electrical connection between the ohmic electrode 54 and the other portion 64'' of the titanium oxide region 64.

The p-n junction diode 10c also has a cathode or ohmic electrode 68 in direct contact with the n+-type semiconductor region 14c. This ohmic electrode 68 may also be a lamination of a gold-germanium alloy layer and a gold layer.

We will now specify the typical dimensions of some pertinent parts of the p-n junction diode 10c with reference to FIG. 7. The dimension $D_1$ of the p-n junction 52 is 900 micrometers. The widths $D_2$, $D_3$ and $D_4$ of the titanium oxide regions 58, 60 and 62 are 140, 20 and 30 micrometers, respectively. The width $D_5$ of the portion 64'' of the titanium oxide region 64 is 40 micrometers.

Figure 8A:
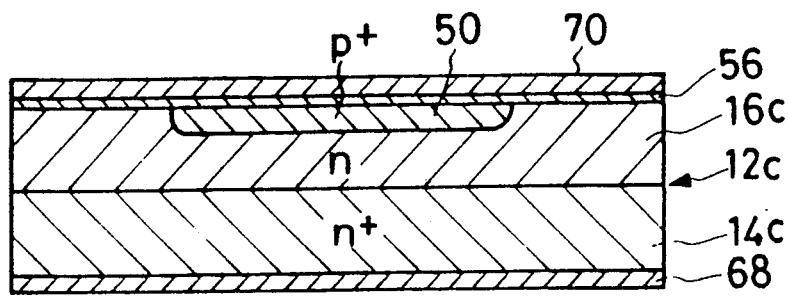
FIG. 8, consisting of (A) through (C), is a series of sectional illustrations showing the sequential steps of fabricating the p-n junction diode of FIGS. 6 and 7 by the method of our invention.

Reference may be had to FIG. 8 for the method of fabricating the FIGS. 6 and 7 diode 10c. First, as shown at (A) in FIG. 8, the semiconductor substrate 12c with its n+-type region 14c and n-type region may be prepared as has been explained in connection with the substrate 12 in FIG. 1(A). The titanium layer 56 and aluminum layer 70 on one side of the substrate 12c, and the ohmic electrode 68 on the other side of the substrate 12c, may also be formed by the same method as with the FIG. 1 diode 10.

Figure 8B:
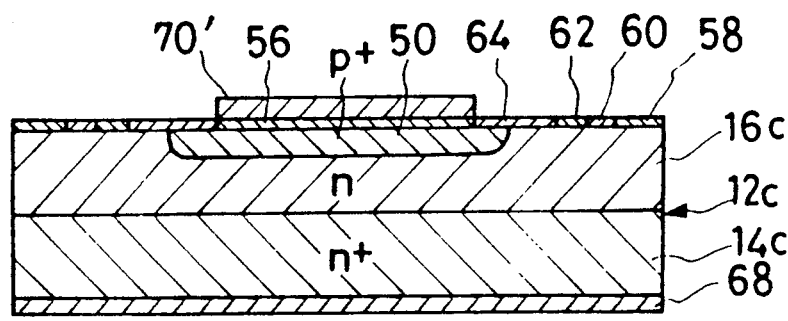
Figure 8C:
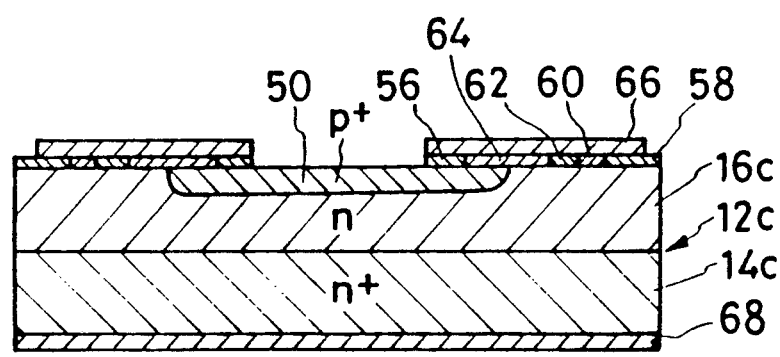

Then, as illustrated in FIG. 8(C), the titanium oxide regions 58–64 may be formed successively, using the overlying aluminum layer 70 as masks, through the procedure of FIGS. 1(C) and (D).

Then the aluminum layer that has remained as at 70' in FIG. 8(B) after the creation of the titanium oxide regions 58–64 may be wholly etched away. The next step is the creation of the silicon oxide layer 66 on the complete top surface of the FIG. 8(B) article from which the aluminum layer has been removed. Then an annular peripheral part and central part of the silicon oxide layer 66, as well as the central part of the underlying titanium layer 56, may be etched away.

FIG. 8(C) shows the resulting article. Both p+-type semiconductor region 50 and the outermost titanium oxide region 60 are partly exposed. Part of the titanium layer remains as the annular unoxidized titanium region 56 around the central aperture that has been formed by etching as above.

Then, finally, the ohmic electrode 54 may be formed on the FIG. 8(C) article by successive vacuum deposition of a gold-germanium alloy and gold and by subsequent etching of peripheral part of the thus-formed layers. The ohmic electrode 54 makes direct contact with the p+-type semiconductor region 50.

The titanium oxide regions 60 and 62 and the portion 64'' of the titanium oxide region 64 constitute the RESP, functioning like the titanium oxide regions 26–30 of the FIG. 1 diode 10. The outermost titanium oxide region 58 contributes to surface stability like the titanium oxide region 24 of the FIG. 1 diode 10. Also, in the FIGS. 6 and 7 diode 10c, the annular peripheral portion 72, FIG. 6, of the ohmic electrode 54 serves as field plate.

The construction of FIGS. 6 and 7 makes possible the efficient production of p-n junction diodes capable of withstanding voltages up to well over 200 volts. We believe that this voltage value is very much close to the maximum voltage-blocking capability of the diode 10c at the central portion of the main rectifying barrier. In other words, the voltage-blocking capability at the peripheral portion of the main rectifying barrier is greatly improved.

Experiment has also proved that the reverse-voltage-versus-reverse-current characteristic of the p-n junction diode 10c is similar to that of the FIG. 1 diode 10 and therefore is as represented by the curve I in the graph of FIG. 3. We also fabricated diodes of the same construction as that of FIGS. 6 and 7 except that the titanium oxide regions 60–64 of different sheet resistances were replaced by a single titanium oxide region, and that a different sheet resistance was given to this single titanium oxide region in each noninventive diode. The characteristics of such noninventive diodes were more or less identical with the curves II and III in the graph of FIG. 3.

It is therefore apparent that the p-n junction diode 10c built on the principles of our invention realizes not only a higher voltage-blocking capability but also a decrease in reverse current. It also makes possible a reduction in the size of semiconductor chips and, in consequence, a decrease in manufacturing cost. Like the Schottky-barrier diode 10 of FIGS. 1 and 2, the p-n junction diode 10c may additionally incorporate the teachings of FIGS. 4 and 5 for withstanding still higher voltages.

Possible Modifications

Although we have shown and described our invention in very specific aspects thereof, we understand, of course, that our invention is not to be limited by the exact details of such disclosure. The following, then, is a brief list of possible modifications or alternations of the foregoing disclosure which we believe fall within the scope of our invention:

1. The sheet resistances of the titanium oxide regions making up the RESP should generally be not less than approximately 10 kilohms per square for the purposes of our invention and from 10 megohms to 10,000 megohms per square for the best results.
2. Ideally, the sheet resistance of the RESP should increase exponentially with respect to the distance from the periphery of the rectifying barrier. However, for practical reasons, the sheet resistance may be varied stepwise by providing two to four titanium oxide regions of different sheet resistances as taught herein.
3. The titanium oxide regions could be replaced by those of tantalum oxide to provide the RESP.
4. The titanium or tantalum oxide regions could be formed by the vapor deposition or sputtering of the metal oxide, instead of by the sequential oxidations of the metal layer preformed on the semiconductor substrate.
5. The purposes of our invention could be substantially attained without the outermost titanium oxide region 24 of the FIG. 1 diode 10 as well as the corresponding titanium oxide regions of all the other diodes 10a–10c disclosed herein. We nevertheless recommend the provision of this outermost titanium oxide region as it makes the preliminary breakdowns of the neighboring titanium oxide region 26, etc., less easy to occur.
6. The improved RESP construction of our invention could be combined with the familiar voltage-blocking techniques such as the guard ring, field plate, field-limiting ring, etc.
7. The invention could be applied to silicon semiconductor devices, although it lends itself to more advantageous use with semiconductors of Groups III–V of the periodic system such as gallium arsenide and indium phosphide.
8. The invention could also be applied to semiconductor devices formed in integrated circuits or to semiconductor devices having the semiconductor regions of the conductivity types opposite to those disclosed herein.

What we claim is:

1. A Schottky-barrier semiconductor device comprising:
   (a) a semiconductor substrate having a semiconductor region of a first conductivity type;
   (b) a Schottky-barrier electrode formed on the semiconductor region for creating a Schottky-barrier therebetween, the Schottky-barrier electrode comprising a first layer of unoxidized titanium formed in direct contact with the semiconductor region and a second layer of a metal other than titanium formed on the first layer; and
   (c) an annular resistive layer of titanium oxide formed around the Schottky-barrier electrode on the semiconductor region and forming a Schottky-barrier at its interface with the semiconductor region, the resistive layer being joined directly to the first layer of the Schottky-barrier electrode and having a sheet resistance which is higher than that of the first layer and which increases as the resistive layer extends away from the first layer, the minimum sheet resistance of the resistance layer being approximately 10 kilohms per square.

2. The Schottky-barrier semiconductor device of claim 1 wherein the second layer of the Schottky-barrier electrode is less in size than the first layer and is so disposed thereon as to leave exposed an annular peripheral part to the first layer.

3. The Schottky-barrier semiconductor device of claim 1 wherein the second layer of the Schottky-barrier electrode is of aluminum.

4. A Schottky-barrier semiconductor device comprising:
   (a) a semiconductor substrate having a semiconductor region of a first conductivity type;
   (b) a Schottky-barrier electrode comprising a metallic material formed on the semiconductor region for creating a Schottky-barrier therebetween;
   (c) an annular resistive layer comprising a metal-oxide material formed around the Schottky-barrier electrode on the semiconductor region and forming a Schottky-barrier at its interface with the semiconductor region, the resistive layer being electrically connected to the Schottky-barrier electrode and having a sheet resistance which is higher than that of the Schottky-barrier electrode and which increases as the resistive layer extends away from the Schottky-barrier electrode, the minimum sheet resistance of the resistive layer being approximately 10 kilohms per square; and
   (d) an insulating layer formed on the resistive layer.

5. The Schottky-barrier semiconductor device of claim 4 wherein the insulating layer is of silicon oxide.

6. The Schottky-barrier semiconductor device of claim 4 further comprising a field plate formed on the insulating layer and electrically connected to the Schottky-barrier electrode.

7. A Schottky-barrier semiconductor device comprising:
   (a) a semiconductor substrate having a semiconductor region of a first conductivity type;
   (b) a Schottky-barrier electrode comprising a metallic material formed on the semiconductor region for creating a Schottky barrier therebetween;
   (c) a first annular resistive region comprising a metal-oxide material formed on the semiconductor region so as to surround the Schottky-barrier electrode and electrically connected to the Schottky-barrier electrode, the first resistive region having a sheet resistance of not less than 10 kilohms per square and creating a Schottky barrier at its interface with the semiconductor region;
   (d) a second annular resistive region comprising a metal-oxide material formed on the semiconductor region so as to surround the first resistive region and electrically connected to the first resistive region, the second resistive region having a higher sheet resistance than that of the first resistive region and creating a Schottky barrier at its interface with the semiconductor region; and (e) an annular equipotential metal region disposed between the first and second resistive regions, the equipotential region being less in sheet resistance than the first and second resistive regions.

8. A Schottky-barrier semiconductor device comprising:
  (a) a semiconductor region;
  (b) a Schottky-barrier electrode formed on the semiconductor region for creating a Schottky barrier therebetween, the Schottky-barrier electrode comprising a first layer of titanium formed on the semiconductor region, a second layer of titanium formed on the first layer, and a third layer of a metal other than titanium formed on the second layer;
  (c) a first annular titanium oxide region formed on the semiconductor region so as to surround the first layer of the Schottky-barrier electrode and electrically connected to the first layer, the first titanium oxide region creating a Schottky barrier at its interface with the semiconductor region; and
  (d) a second annular titanium oxide region formed on part of the first titanium oxide region so as to surround the second layer of the Schottky-barrier electrode and electrically connected to the second layer, the second titanium oxide region being less in sheet resistance than the first titanium oxide region.

9. The Schottky-barrier semiconductor device of claim 8 wherein the third layer of the Schottky-barrier electrode is of anluminum.

10. A p-n junction semiconductor device comprising:
  (a) a first semiconductor region of a first conductivity type;
  (b) a second semiconductor region having a second conductivity type opposite to the first conductivity type and being less in resistivity than the first semiconductor region, the first and second semiconductor regions being disposed contiguous to each other to create a p-n junction therebetween;
  (c) an ohmic electrode formed on the second semiconductor region;
  (d) an annular resistive layer formed on the first semiconductor region so as to surround the ohmic electrode and creating a Schottky barrier at its interface with the first semiconductor region, the resistive layer being electrically connected to the ohmic electrode and having a sheet resistance which is higher than that of the ohmic electrode and which increases as the resistive layer extends away from the ohmic electrode, the minimum sheet resistance of the resistive layer being approximately 10 kilohms per square; and
  (e) an annular resistance region formed on the second semiconductor region and interposed between the annular resistive layer and the ohmic electrode, the resistive region being electrically connected to both the resistive layer and the ohmic electrode.

11. The p-n junction semiconductor device of claim 10 wherein the resistive layer is of titanium oxide, and the resistive region is of unoxidized titanium.

12. A schottky-barrier semiconductor device comprising:
  (a) a semiconductor substrate having a semiconductor region of a conductivity type;
  (b) a Schottky-barrier electrode formed on the semiconductor region for creating a Schottky-barrier therebetween;
  (c) a first resistive region formed on the semiconductor region so as to surround the Schottky-barrier electrode and electrically connected to the Schottky-barrier electrode, the first resistive region having a sheet resistance of not less than 10 kilohms per square and creating a Schottky-barrier at its interface with the semiconductor region;
  (d) a second resistive region formed on the semiconductor region so as to surround the first resistive region and electrically connected to the first resistive region, the second resitive region having a higher sheet resistance than that of the first resistive region and creating a Schottky-barrier at its interface with the semiconductor region; and
  (e) an annular equipotential metal region disposed between the first and second resistive regions, the equipotential region being less in sheet resistance than the first and second resistive regions.

13. A Schottky-barrier semiconductor device comprising:
  (a) a semiconductor substrate having a semiconductor region of a conductivity type;
  (b) a Schottky-barrier electrode formed on the semiconductor region for creating a Schottky-barrier therebetween, the Schottky-barrier electrode comprising a first layer of unoxidized titanium formed in direct contact with the semiconductor region and a second layer of a metal other than titanium formed on the unoxidized titanium layer;
  (c) a first resistive region of titanium oxide formed on the semiconductor region so as to surround the Schottky-barrier electrode and directly joined to the first layer of the Schottky-barrier electrode, the first resistive region having a sheet resistance of not less than 10 kilohms per square and creating a Schottky-barrier at its interface with the semiconductor region; and
  (d) a second resistive region of titanium oxide formed on the semiconductor region so as to surround the first resistive region and electrically connected to the first resistive region, the second resistive region having a higher sheet resistance than that of the first resistive region and creating a Schottky-barrier at its interface with the semiconductor region.

14. The Schottky-barrier semiconductor device of claim 13 wherein the second layer of the Schottky-barrier electrode is less in size than the first layer and is so disposed thereon as to leave exposed an annular peripheral part of the first layer.

15. The Schottky-barrier semiconductor device of claim 13 wherein the second layer of the Schottky-barrier electrode is of aluminum.

16. A Schottky-barrier semiconductor device comprising:
  (a) a semiconductor substrate having a semiconductor region of a conductivity type;
  (b) a Schottky-barrier electrode formed on the semiconductor region for creating a Schottky-barrier therebetween;
  (c) a first resistive region formed on the semiconductor region so as to surround the Schottky-barrier electrode and electrically connected to the Schottky-barrier electrode, the first resistive region having a sheet resistance of not less than 10 kilohms per square and creating a Schottky-barrier at its interface with the semiconductor region;
  (d) a second resistive region formed on the semiconductor region so as to surround the first resistive region and electrically connected to the first resistive region, the second resistive region having a higher sheet resistance than that of the first resistive region and creating a Schottky-barrier at its interface with the semiconductor region; and
(e) an insulating layer formed on the first and second resistive regions.

17. The Schottky-barrier semiconductor device of claim 16 wherein the insulating layer is of silicon oxide.

18. The Schottky-barrier semiconductor device of claim 16 further comprising a field plate formed on the insulating layer and electrically connected to the Schottky-barrier electrode.

19. A p-n junction semiconductor device comprising:
(a) a semiconductor substrate, the semiconductor substrate having a first semiconductor region of a first conductivity type, and a second semiconductor region having a second conductivity type opposite to the first conductivity type and being less in resistivity than the first semiconductor region, the first and second semiconductor regions being disposed contiguous to each other to create a p-n junction therebetween;
(b) an ohmic electrode formed on the second semiconductor region;
(c) a first resistive region formed on the first semiconductor region so as to surround the ohmic electrode and electrically connected to the ohmic electrode, the first resistive region having a sheet resistance of not less than 10 kilohms per square and creating a Schottky-barrier at its interface with the first semiconductor region;
(d) a second resistive region formed on the first semiconductor region so as to surround the first resistive region and electrically connected to the first resistive region, the second resistive region having a higher sheet resistance than that of the first resistive region and creating a Schottky-barrier at its interface with the first semiconductor region; and
(e) an annular equipotential metal region disposed between the first and second resistive regions, the equipotential region being less in sheet resistance than the first and second resistive layers.

20. A p-n junction semiconductor device comprising:
(a) a semiconductor substrate having a semiconductor region of a conductivity type;
(b) a Schottky-barrier electrode formed on the semiconductor region for creating a Schottky-barrier therebetween, the Schottky-barrrier electrode comprising a first layer of titanium formed on the semiconductor region, and a second layer of titanium formed on the first layer, and a third layer of a metal other than titanium formed on the second layer;
(c) a first titanium oxide region formed on the semiconductor region so as to surround the first layer of the Schottky-barrier electrode and electrically connected to the first layer, the first titanium oxide region creating a Schottky-barrier at its interface with the semiconductor region; and
(d) a second titanium oxide region formed on part of the first titanium oxide layer so as to surround the second layer of the Schottky-barrier electrode and electrically connected to the second layer, the sheet resistance of the second titanium oxide region being less than the sheet resistance than the first titanium oxide region.

* * * * *